United States Patent [19]

Morrow et al.

[11] 4,112,382
[45] Sep. 5, 1978

[54] DIGITAL SWEEP CIRCUIT FOR GENERATING SAWTOOTH WAVE FORM

[75] Inventors: Robert S. Morrow, Columbus; Lloyd D. Penn, Johnstown, both of Ohio

[73] Assignee: IRD Mechanalysis, Inc., Columbus, Ohio

[21] Appl. No.: 677,143

[22] Filed: Apr. 15, 1976

Related U.S. Application Data

[62] Division of Ser. No. 637,751, Dec. 4, 1975, Pat. No. 4,044,310, which is a division of Ser. No. 420,594, Nov. 30, 1973, Pat. No. 3,938,394.

[51] Int. Cl.² .......................... H03K 4/10; H03K 4/02
[52] U.S. Cl. ..................................... 328/181; 307/227; 307/228; 328/186; 328/183; 331/178
[58] Field of Search ................ 307/228, 227; 331/178; 328/181, 186, 183; 331/177, 179

[56] References Cited

U.S. PATENT DOCUMENTS

| | | | |
|---|---|---|---|
| 2,683,219 | 7/1954 | Mohr | 331/178 |
| 3,456,554 | 7/1969 | Goodwin | 307/227 |
| 3,681,706 | 8/1972 | Harzer | 331/178 |
| 3,749,938 | 7/1973 | Van Winkler | 307/227 |
| 3,875,525 | 4/1975 | Ballinger et al. | 331/179 |
| 3,886,486 | 5/1975 | Maddox | 331/178 |

*Primary Examiner*—Stanley D. Miller, Jr.
*Attorney, Agent, or Firm*—Harry B. Keck; George E. Manias

[57] ABSTRACT

A combination electronic device provides a digital sweep circuit adapted to generate a sweep signal which increases in frequency at constant intervals over a selected range of frequencies and over a selected period of time.

7 Claims, 2 Drawing Figures

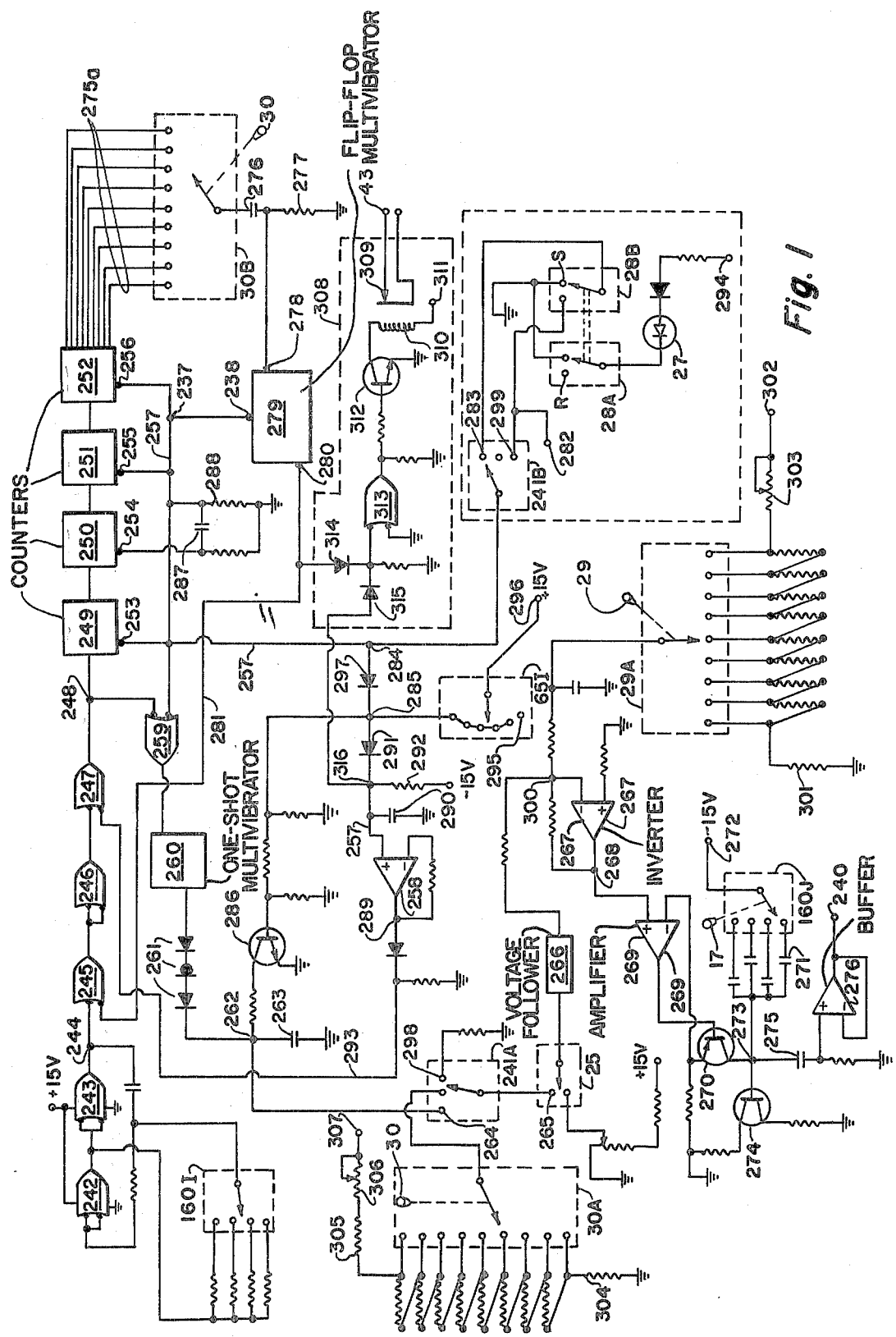

DIGITAL SWEEP CIRCUIT FOR GENERATING SAWTOOTH WAVE FORM

CROSS-REFERENCES TO RELATED APPLICATIONS

This is a division of Ser. No. 637,751, filed Dec. 4, 1975, now U.S. Pat. No. 4,044,310, which in turn is a division of Ser. No. 420,594, filed Nov. 30, 1973, now U.S. Pat. No. 3,938,394.

BACKGROUND OF THE INVENTION

1. Field of the Invention

The invention relates to digital sweep circuitry for generating an electrical signal having a uniformly increasing frequency.

2. Description of the Prior Art

Digital sweep circuitry is known which approximates linearity of frequency-sweep with respect to time.

SUMMARY OF THE INVENTION

A digital sweep circuit is provided which employs a free running electronic clock which generates square waves at one of several selected frequencies. The generated square wave is converted into a chain of pulses which are counted in electronic counters and are applied as fixed incremental electrical charges on a capacitor. Thus, the capacitor is charged at a uniform rate and its voltage increases in uniform increments. The voltage across the capacitor is converted to a corresponding current which drives a signal generator producing a sawtooth wave of constant amplitude at a frequency corresponding to the instantaneous charge on the capacitor. Adjustment means are provided within the digital sweep circuit for setting the minimum and maximum values of the sweeping range.

BRIEF DESCRIPTION OF THE DRAWING(S)

FIG. 1 is a schematic illustration of digital sweep circuitry for generating a linear frequency sweep signal;

DESCRIPTION OF THE PREFERRED EMBODIMENT(S)

Digital Sweep Circuitry

Figures 16, 17:
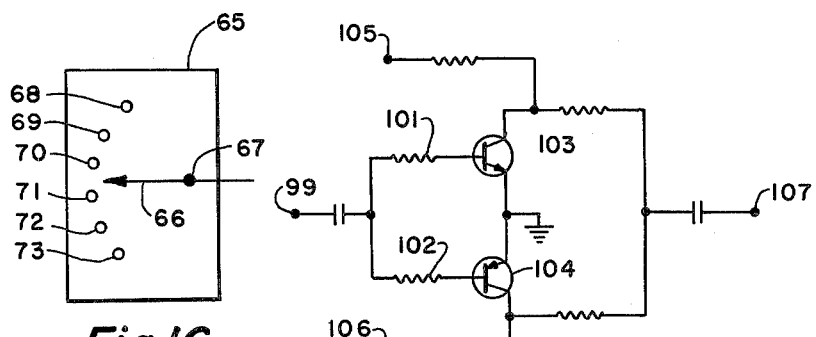
Figure 18:
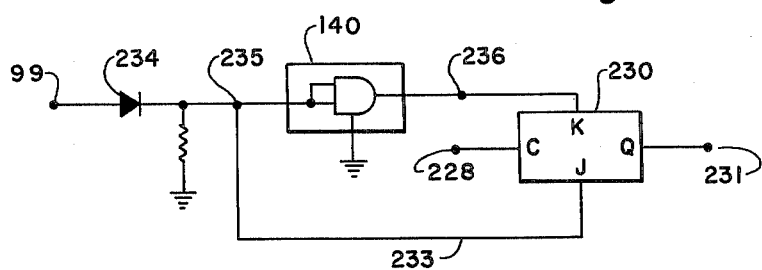
Figures 2, 19:
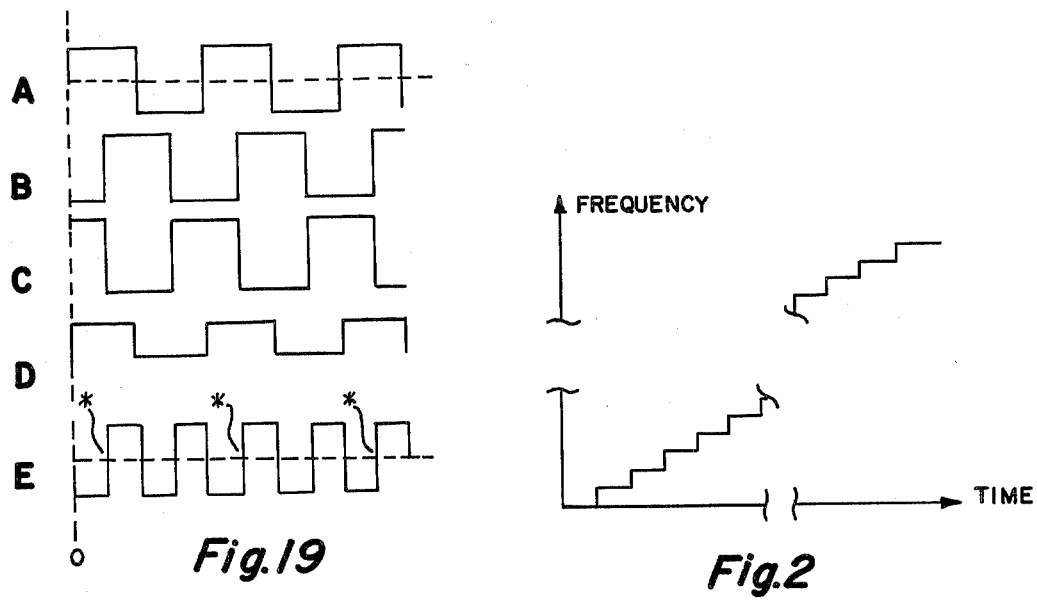
FIG. 2 is a graphical representation of the digital sweep circuit output signal.

The digital sweep circuitry of this invention will now be described by reference to FIGS. 1 and 2. The function of the digital sweep circuitry is to produce a driving signal which increases linearly in frequency with respect to time. The output signal is delivered at an output terminal 240. The digital sweep circuit develops a signal whose frequency increases in incremental uniform steps uniformly with time in the manner shown graphically in FIG. 2. In a preferred embodiment of the invention, a total of 2,000 increments is provided over the selected range of operation. By adjusting a minimum frequency knob 29 (FIG. 1) the initial frequency can be selected as a fraction of the total range. By adjusting a maximum frequency knob 30 (FIG. 1) which is ganged mechanically to the switches 30A, 30B (FIG. 1) it is possible to adjust the maximum range of the frequency scan. The overall ranges may be adjusted with the knob 17 which corresponds to switch decks 160I and 160J of FIG. 1.

The recorder selector includes two decks, 241A, 241B, in FIG. 1. A toggle switch 25 appears in FIG. 1. A reset button 28 appears as two switch decks 28A, 28B in FIG. 1. An indicator light 27 appears as a light-emitting diode 27 in FIG. 1.

The operation of the digital sweep circuit will now be described. The upper left hand corner of FIG. 1 includes a pair of electron gates 242, 243 connected in series with an R-C circuit to generate a square wave signal at an output terminal 244 having a fixed frequency corresponding to the R-C constants of the circuit. The R-C constants are adjusted at the switch 160I which is automatically positioned when the frequency range knob 17 is positioned. The signal appearing at the output terminal 244 is a square wave which is delivered through three electron gates including a latch gate 245, an inverter 246 and a time delay gate 247. The gates 245, 247 are arranged to deliver the applied square wave signal so long as the control terminals are "low." The inverter 246 merely changes a "high" to a "low" and changes a "low" to a "high" in order to accommodate subsequent circuitry requirements. A square wave clock signal thus is applied to a clock terminal 248.

A chain of counters 249, 250, 251, 252 is provided to count 2,000 pulses of the square wave applied at the clock terminal 248. In a preferred embodiment illustrated in FIG. 1, the counters 249, 251, 252 are Johnson counters having a 10-to-1 counting capacity. The counter 250 is D-type flip-flop multi-vibrator which has a two-times counting capability. The counters are arranged so that the final counter 252 has nine output terminals connected to nine corresponding switch terminals of the switch deck 30B. The wiper arm of the switch deck 30B can be shifted from its normally "low" output state to a "high" output state at 10% increments over the range of 2,000 counts, i.e., at 200 counts, 400 counts, 600 counts . . . 1600 counts, 1800 counts and 2000 counts. The counters 249, 250, 251, 252 have control terminals 253, 254, 255, 256 respectively which must be in a "low" state in order for the counters to operate. All of the control terminals 249, 250, 251, 252 are connected to a reset conductor 257 which extends from the terminals 253, 254, 255, 256 through diodes 297, 291 to an integrated circuit 258 hereinafter to be described.

The clock signal from the clock terminal 248 also is delivered through a control gate 259 to a one shot multi-vibrator 260 which converts the square wave clock signal into corresponding electrical pulses each having a precisely uniform pulse and a precisely uniform pulse amplitude. Thus each of the pulses from the one shot multi-vibrator 260 has a predetermined charge. The pulses are delivered through a constant current diode chain 261 to a charge terminal 262 which is connected to a charging capacitor 263. The charge on the capacitor 263 increases in uniform steps with each pulse from the one shot multi-vibrator 260. Accordingly the voltage which is developed at the charge terminal 262 increases in uniform steps uniformly with time. The voltage from the charging terminal 262 is thereafter converted to a corresponding electrical current which is in turn converted to an electrical signal of corresponding frequency as will now be described. The stepwise increasing voltage from the charge terminal 262 is delivered through the "operate" terminal 264 of a switch deck 241A to the "automatic" terminal 265 of the switch deck 25A and thence through a voltage follower 266 to an inverter 267. The inverter 267 is provided to accommodate the succeeding circuitry requirements. The inverted signal is delivered from an output terminal 268 of the inverter 267 to an integrated circuit amplifier 269 having a transistor 270 in its feedback circuit. A characteristic of this circuit is that the current flowing through the transistor 270 corresponds with the applied voltage from the terminal 268. The collector of the transistor 270 is connected through one of the capacitors 271 to a source 272 of negative voltage. One of the capacitors 271 is automatically selected as the frequency range knob 17 (FIG. 1) sets the wiper arm of the switch deck 160J. The selected capacitor 271 is drained of its charge by the current flowing through the transistor 270. The voltage at a terminal 273 between the selected capacitor 271 and the emitter of the transistor 270 thus increases at a rate depending upon the current flowing through the transistor 270. The terminal 273 is connected to the base of a unijunction transistor 274. When the voltage at the terminal 273 exceeds the breakdown voltage of the unijunction transistor 274, the remaining charge on the selected capacitor 271 is discharged through the unijunction transistor 274. Thus the voltage at the terminal 273 drops to zero as the terminal 273 is grounded through the unijunction transistor 274. Instantly the unijunction transistor 274 becomes nonconductive and the voltage at the terminal 273 is permitted to increase again at a rate which is determined by the current flowing through the transistor 270. Thus when the current flowing through the transistor 270 is relatively small (corresponding to a relatively small voltage at the terminals 262, 268) the time required for the selected capacitor 271 to become charged is relatively long. The wave length of the sawtooth wave at the terminal 273 is thus relatively long. As the current flowing through the transistor 270 increases (corresponding to increased voltage at the terminals 262, 268) the time required for the selected capacitor 271 to become charged decreases so that the wave length of the sawtooth signal at the terminal 273 is shorter. Thus the frequency of the electrical signal at the terminal 273 is proportional to the voltage at the terminals 262, 268. Inasmuch as the voltage at the terminal 262 increases in uniform steps, uniformly with time, the frequency of the signal at the terminal 273 likewise increases in uniform steps uniformly with time. The signal from the terminal 273 is delivered through a coupling capacitor 275 to an integrated circuit 276, functioning as a buffer, to an output terminal 240. The duration of the sawtooth pulses in the output signal at terminal 240 constitutes a minor fraction of the time lapse between pulses. Thus the output signal at terminal 240 supplies a sawtooth pulse wave which can be employed as a reference signal of known increasing frequency.

Reverting to the clock terminal 248, the square wave clock signal is delivered through the counters 249, 250, 251, 252 until the counters have exhausted their counting capacity at which time the normally "low" state at the output terminal 275A is switched to a "high" state. The transition is applied through the switch deck 30B and is integrated in a capacitor 276 and resistor 277 to produce a spike or pulse at the input terminal 278 of a flip-flop multi-vibrator 279. The flip-flop multi-vibrator 279 has a normally "low" state at its output terminal 280. The "low" state is applied to a conductor 281 and to the operating terminal of the latch gate 245 thus maintaining the gate 245 open during normal operation. The appearance of a pulse at the input terminal 278 of the flip-flop multi-vibrator 279 converts the state of the output terminal 280 to a "high." The "high" is applied to the conductor 281 and to the operating terminal of the latch gate 245 thereby disabling the gate 245 so that no further signals are delivered to the clock terminal 248 when the maximum frequency has been achieved.

When the maximum frequency has been achieved and the output terminal 280 of the flip-flop multi-vibrator 279 is in a "high" state, the capacitor 263 remains fully charged for significant periods of time inasmuch as low leakage components are employed. The system can be reset for renewed operation by depressing the reset button 28 which has two decks 28A, 28B. The reset position is marked R and the start position is marked S in FIG. 1. When the switch 28 is moved to the R position, a positive voltage from a positive source terminal 282 is delivered through the switch deck 28B to the "operate" terminal 283 of the switch deck 241B and thence to a reset terminal 284 in the reset conductor 257. So long as the reset switch 28 remains in the reset position R, the reset conductor 257 is connected to the positive voltage source 282.

Application of the positive voltage to the reset conductor 257 accomplishes a number of results.

The positive voltage is delivered from a terminal 285 to the base of a transistor 286. Accordingly the transistor 286 becomes conducting and the capacitor 263 is discharged to ground.

The positive voltage from the reset terminal 284 is delivered through the conductor 257 to the control terminals 253, 254, 255, 256 of the counters 249, 250, 251, 252 respectively, thereby resetting each of the counters to zero. It will be observed that the counter 250 which is a D-type flip-flop multi-vibrator is connected to the conductor 257 through an integrator consisting of a capacitor 287 and a resistor 288 which applies a pulse to the control terminal 254 as required to reverse the state of a D-type flip-flop multi-vibrator 250.

When the system is started for a further activity, the reset button 28 is moved to the start position S. This disconnects the positive source 282 and provides a path for grounding the potential of the reset conductor 257. A terminal 237 in the reset conductor 257 is connected to a reset terminal 238 of the flip-flop multi-vibrator 279. As the state of the terminal 287 shifts from "high" to "low," the output terminal 280 of the flip-flop multi-vibrator 279 also reverts from the "high" state to a "low" state. The "low" state is applied to the conductor 281 and to the operating terminal of the latch gate 245, enabling the clock signal to pass into the inverter 246 and to the clock terminal 248.

Removal of the voltage from the base of the transistor 286 renders the transistor 286 nonconductive so that the capacitor 263 may be recharged.

Time Delay Circuit

A time delay circuit is provided in the system. Normally about an 8 seconds time delay is adequate. The time delay circuitry includes an electron switch 258 (FIG. 1) having its positive terminal connected to the reset conductor 257. The output of the electron switch 258 is applied to the control terminal of the time delay gate 247. Normally the output terminal 289 of the electron switch 258 is maintained in a "low" state. During the reset operation, a capacitor 290 becomes charged to the 15 volts value of the reset conductor 257.

A diode 291 is provided in the reset conductor 257 between the reset terminal 284 and the electron switch 258. Thus when the 15 volts source 282 is disconnected from the reset conductor 257 and the reset terminal 284 is connected to ground through the start terminal S of the switch deck 28B, the 15 volts potential slowly discharges from the capacitor 290 through a resistor 292. When the potential at the positive terminal of the electron switch 258 drops below the threshold, the output 289 changes state from "high" to "low" and applies a "low" through a time delay conductor 293 to the control terminal of a time delay gate 247.

The reset button 28 in the start position also connects a power source terminal 294 through a light emitting diode 27 via the switch deck 28A to ground. Thus the light emitting diode 27 ignites when the reset switch 28 is in the state position. This is particularly important because of the time delay circuitry just described. In the absence of a light emitting diode 27, the system operator might not be aware that the system was connected because of the eight seconds time delay normally built into the system.

The digital sweep circuit operates only during the spectrum analysis mode. The switch deck 65I has all of its terminals except the spectrum analysis terminal 295 connected through its wiper arm to a source 296 of positive voltage at about 15 volts. The remaining terminals of the switch deck 65I are connected to the terminal 285 in the reset conductor line 257 between a pair of diodes 291, 297. Thus a 15 volts source is applied to the base of the transistor 286 in all modes except spectrum analysis to preclude build-up of voltage at the charge terminal 262. Similarly the 15 volt source is applied through the terminal 285 to the electronic switch 258 to disable the time delay gate 247.

Frequency Range Adjustments

The range adjustments are made for minimum frequency with the recorder selector knob 26 in the "zero calibrate" position and for maximum frequency with the recorder selector knob 26 in the "full scale" calibrate position.

To set the minimum frequency the switch decks 241A, 241B have the wiper arms connected to the "zero calibrate" terminals 298, 299. In this position, the positive voltage source 282 is connected through the "zero calibrate" terminal 299 of the switch deck 241B to the reset terminal 284, thereby inactivating the clock signals at clock terminal 248. A mixer terminal 300 is connected to ground through the voltage follower 266, the switch deck 25A and the zero calibrate terminal 298 of the switch deck 241A. The mixer terminal 300 also is connected to the wiper arm of the minimum frequency switch deck 29A. The minimum frequency switch deck 29A has nine terminals which are connected to each other by single resistors in a chain. One end resistor is connected to ground through a resistor 301. The other end terminal is connected to a source 302 of positive voltage through a rheostat 303. Thus the voltage applied to the wiper arm of the switch deck 29A can be varied in uniform increments. This voltage is applied to the mixer terminal 300 and thence through the inverter 267 to the positive terminal of the integrated circuit 269. This constant uniform voltage from the mixer terminal 300 will develop a uniform frequency output signal at the output terminal 240. This signal can be observed on a frequency meter.

The "full scale" calibration of the system is carried out with the switch decks 241A, 241B in the "full scale" calibrate position, that is with the wiper arm connected to the central terminal in the switch decks 241. Referring to the switch deck 241A, it will be observed that the "full scale" calibrate terminal is connected to the wiper arm of the switch 30A. The switch 30A has nine terminals which are connected to each other by resistors in a chain. The bottom terminal is connected by a resistor 304 to ground. The top terminal is connected by a resistor 305 and a rheostat 306 to a positive source 307, normally 15 volts. Thus a suitable voltage can be applied in uniform increments through the terminals of the switch 30A to the switch deck 241A and thence through the switch 25A and voltage follower 266 to the mixer terminal 300. At the mixer terminal 300 the voltage applied from the switch deck 30A is mixed with the already established voltage from the switch deck 29A. So long as the voltage from the switch deck 30A exceeds the voltage from the switch deck 29A, a signal will be developed at the output terminal 240 corresponding to the difference between the voltage from the deck 30A and the voltage from the deck 29A. The frequency of that signal at terminal 240 can be indicated directly on a frequency meter.

If the instrument is operating in the frequency band from 600 Hertz to 6,000 Hertz as a result of the setting of the frequency range knob 17 and the corresponding switch decks 160, the minimum frequency knob 29 and maximum frequency knob 30 will permit the operator to inspect and to record all of the range or less than all of the range. For example, the operator can observe and record frequencies from 1,800 to 4,200 Hertz. This smaller range may be spread entirely across the X-Y coordinate paper (of an X-Y recorder) for enlarged scale plotting of the observations. It will be observed that the maximum frequency knob 30 is mechanically connected to the switch deck 30B associated with the last Johnson counter 252. Thus when the maximum frequency is established by the knob 30, the corresponding range of the counter chain is established so that the remainder of the circuitry shuts down at the desired maximum frequency.

The minimum frequency adjustment knob 29 applies a threshold voltage at the mixer terminal 300 corresponding to the setting of the knob 29. For example if the system is in the 600–6,000 cycle frequency range and the desired sweep is from 2,400 to 6,000 cycles, the voltage delivered from the switch 29 to the mixer point will be a voltage corresponding to 2,400 cycles. Thus the output signal at the terminal 240 resulting directly from the voltage at mixer terminal 300 from switch 29 will be a 2,400 cycle signal. Thereafter as the system starts up, the voltage at the charge terminal 262 increases from zero and the resulting signal at the output terminal 240 increases in frequency from the established base of 2,400 cycles.

When the maximum frequency switch 30 thereafter is adjusted with the switch 241A in the "full scale" calibrate position, the voltage from the switch deck 30A is added to the voltage from the switch deck 29A at the mixer terminal 300. If the full scale voltage from the switch deck 30A were to be applied in the example, the output signal at the terminal 240 would correspond to 8,400 cycles, that is 2,400 cycles resulting from the electrical signal delivered from the switch deck 29A and 6,000 cycles resulting from the full scale voltage delivered from the switch deck 30A. In order that the output frequency will be within the desired range, that is 2,400–6,000 cycles, the switch 30 is adjusted until a frequency meter 11 indicates 6,000 cycles. The adjustment of the switch 30 also adjusts the switch deck 30B and reduces the counting excursion of the counter chain correspondingly. Thus in the given example where the normal range is 600 to 6,000 cycles per second, the total range is 5,400 cycles. The normal counting excursion of the counter chain is 2,000 counts. Hence the normal counting rate is 2.7 Hertz per count. Thus if 30% of the lower portion of the range is to be eliminated, this is 0.3 times 5,400 Hertz equals 1,620 Hertz above the 600 Hertz threshold. Thus the final range would be 2,220 to 6,000 Hertz. The counter 252, FIG. 1, would terminate counting after 1,400 counts.

Pen Lift Circuit

A pen lift circuit is illustrated by the broken line enclosure 308 in FIG. 1. The pen lift circuit includes a pen lift outlet 43 having a solenoid switch 309 including a coil 310 which is connected to a source 311 of positive voltage and through a transistor 312 to ground. The base of the transistor 312 is connected to the output terminal of a gate 313. The control terminal of the gate 313 is connected through a diode 314 to the conductor 281. The control terminal of the gate 313 also is connected through a diode 315 to a terminal 316 in the reset conductor 257. When the base of the transistor 312 receives a positive charge, the transistor 312 becomes conducting, current flows through the solenoid coil 310 and the pen lift circuit 43 is closed. The base of the transistor 312 receives a charge when the control terminal of the gate 313 is "low." The control terminal of the gate 313 will be "low" when the conductor 281 is "low" and when the terminal 316 is "low." The conductor 281 is "low" so long as the counter chain 249, 250, 251, 252 is actively counting. As soon as the counting terminates, the terminal 280 of the flip-flop multi-vibrator 279 becomes "high" and this causes the gate 313 to develop a "low" at its output terminal which is applied to the base of the transistor 312, which interrupts the flow of current through the transistor 312 and through the solenoid coil 310. The terminal 316 also is "high" when the reset switch 28B is in the reset position R. The terminal 316 remains "high" after the reset switch 28B has been moved to the start position S until the delay circuit capacitor 290 discharges. This requires about 8 seconds. Hence the pen lift circuit 308 is activated at the same instant that the activating signal is delivered from the delay circuit through the conductor 293 to the time delay gate 247.

We claim:

1. A digital sweep circuit adapted to generate an electrical output signal having multiple cycles at each of uniformly increasing frequencies comprising:

clock means for generating uniformly spaced constant voltage signals;

a constant current conductor connecting said clock means to a first capacitor for charging the said first capacitor with a uniform charge increment with each clock signal;

output signal generating means adapted to generate a repeating output signal corresponding in frequency to an applied voltage;

conductor means connecting the said first capacitor to said output signal generating means for delivering the voltage of said first capacitor as the applied voltage for the said output signal generating means.

2. The digital sweep circuit of claim 1 wherein the said clock means includes:

means for generating a square wave electrical signal having a pre-established frequency;

counting means connected to said means for generating a square wave electrical signal, said counting means totaling the number of square waves in the said square wave electrical signal;

means connected to the said counting means for initiating the said totaling and means connected to said counting means responsive to a selected total of said square wave electrical signals for maintaining the corresponding instantaneous charge of said first capacitor; and means between said first capacitor and said means for generating a square wave electrical signal for developing the said uniformly spaced constant voltage signals corresponding to the said square wave electrical signals while the said counting means is totaling the said square wave electrical signals.

3. The digital sweep circuit of claim 1 wherein the said output signal generating means includes:

current generating means connected to the said first capacitor and adapted to generate an electrical current proportional to the instantaneous voltage across the said capacitor;

a second capacitor connected to said current generating means and means for applying the said generated current to the said second capacitor;

threshold voltage responsive means connected to said second capacitor for discharging the said second capacitor at a pre-established charge to produce a sawtooth output signal having a frequency corresponding to the generated current.

4. The digital sweep circuit of claim 1 wherein the said clock means is continuously running and the said capacitor is normally connected by a shunt to ground; including switch means for activating said digital sweep circuit by interrupting the said shunt.

5. The digital sweep circuit of claim 4 wherein the said switch means includes a delay means for interrupting said shunt after a pre-established time delay following the activation of said switch means.

6. The digital sweep circuit of claim 5 wherein the said switch means includes a visible indicator which is activated immediately upon the activation of the said switch means to provide a positive indication that the switch means has been activated throughout the said pre-established time delay.

7. The digital sweep circuit of claim 3 wherein the said output signal extends from a minimum frequency to a maximum frequency and including:

a first voltage source;

a mixer terminal;

means connecting the said mixer terminal to (a) the said voltage across the said capacitor, and (b) the said first voltage source;

means connecting the said mixer terminal to the said current generating means; and means for adjusting the voltage of the said first voltage source to develop an output sawtooth signal having the desired minimum frequency while the said capacitor is grounded.

* * * * *

UNITED STATES PATENT OFFICE
CERTIFICATE OF CORRECTION

Patent No. 4,112, 382                 Dated September 5, 1978

Inventor(s) Robert S. Morrow and Llyod D. Penn

It is certified that error appears in the above-identified patent and that said Letters Patent are hereby corrected as shown below:

Cancel Figures 16, 17, 18, 19.

Signed and Sealed this

*Twentieth* Day of *March 1979*

[SEAL]

*Attest:*

RUTH C. MASON
*Attesting Officer*

DONALD W. BANNER
*Commissioner of Patents and Trademarks*